(12) United States Patent
Poulton et al.

(10) Patent No.: US 8,605,397 B2
(45) Date of Patent: Dec. 10, 2013

(54) CONFIGURABLE, POWER SUPPLY VOLTAGE REFERENCED SINGLE-ENDED SIGNALING WITH ESD PROTECTION

(75) Inventors: John W. Poulton, Chapel Hill, NC (US); Frederick A. Ware, Los Altos Hills, CA (US); Carl W. Werner, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 73 days.

(21) Appl. No.: 13/318,475

(22) PCT Filed: Mar. 29, 2010

(86) PCT No.: PCT/US2010/029101
§ 371 (c)(1),
(2), (4) Date: Nov. 1, 2011

(87) PCT Pub. No.: WO2010/129112
PCT Pub. Date: Nov. 11, 2010

(65) Prior Publication Data
US 2012/0057261 A1    Mar. 8, 2012

Related U.S. Application Data

(60) Provisional application No. 61/176,411, filed on May 7, 2009.

(51) Int. Cl.
*H02H 3/22* (2006.01)
(52) U.S. Cl.
USPC ........................................... 361/56; 361/111

(58) Field of Classification Search
USPC ..................................................... 361/56, 111
See application file for complete search history.

(56) References Cited

U.S. PATENT DOCUMENTS

| | | | |
|---|---|---|---|
| 6,005,414 A | 12/1999 | Reay | |
| 6,184,717 B1 | 2/2001 | Crick | 326/86 |
| 6,320,494 B1 | 11/2001 | Bartels et al. | 340/310.01 |
| 7,459,938 B2 | 12/2008 | To et al. | 326/83 |
| 2004/0057525 A1* | 3/2004 | Rajan et al. | 375/257 |
| 2005/0285620 A1* | 12/2005 | Wehage et al. | 326/16 |
| 2006/0015275 A1* | 1/2006 | Batra et al. | 702/64 |
| 2008/0048730 A1 | 2/2008 | Bae | |
| 2008/0290976 A1* | 11/2008 | Feldtkeller | 336/170 |
| 2009/0219179 A1 | 9/2009 | Bae | |

OTHER PUBLICATIONS

PCT International Search Report and Written Opinion, PCT/US2010/029101, Sep. 6, 2010, 12 Pages.
EP Response dated Apr. 25, 2012 to the Invitation to Respond re EP Application No. 10728464.8 dated Dec. 20, 2011, 8 pages.
Honda, Jun & Adams, Jonathan "Class D Audio Amplifier Basics", Application Note AN-1071. International IOR Rectifier, Application Note dated Feb. 8, 2005, 14 Pages.

\* cited by examiner

*Primary Examiner* — Danny Nguyen
(74) *Attorney, Agent, or Firm* — Fenwick & West LLP

(57) ABSTRACT

A single-ended data transmission system transmits a signal having a signal voltage that is referenced to a power supply voltage and that swings above and below the power supply voltage. The power supply voltage is coupled to a power supply rail that also serves as a signal return path. The signal voltage is derived from two signal supply voltages generated by a pair of charge pumps that draw substantially same amount of current from a power supply.

37 Claims, 15 Drawing Sheets

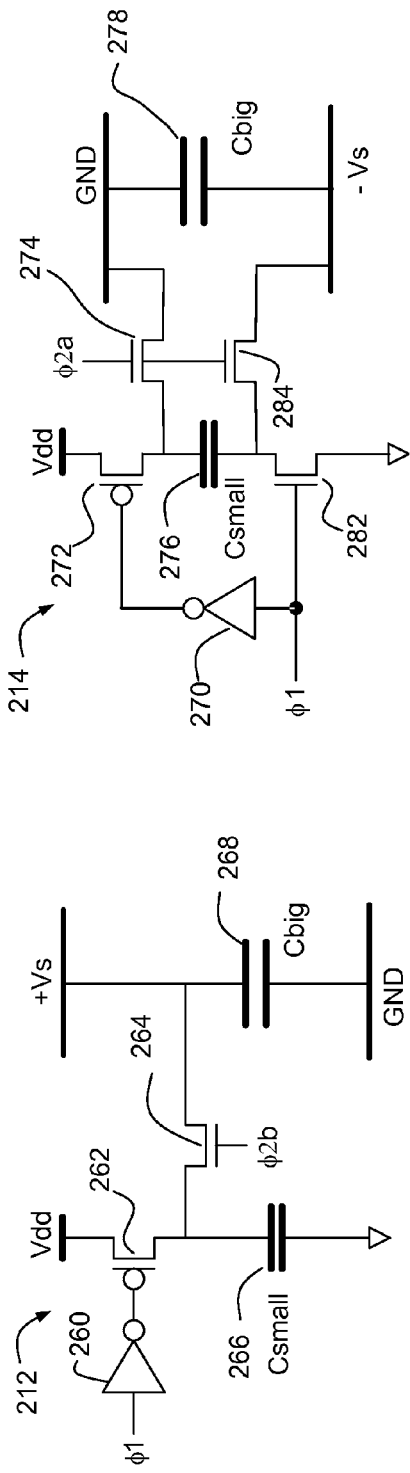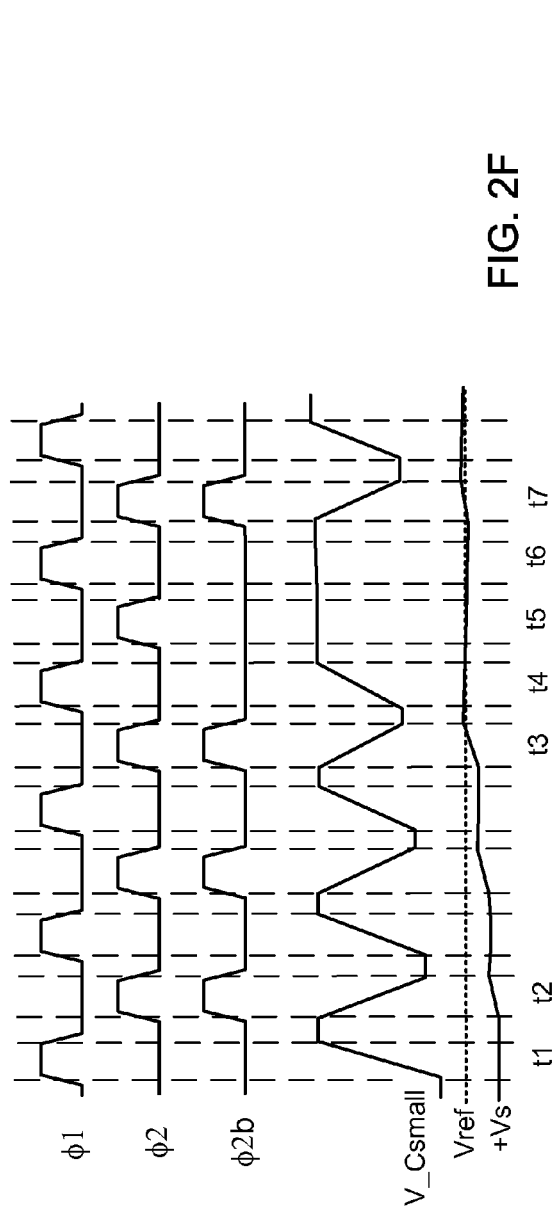

CONFIGURABLE, POWER SUPPLY VOLTAGE REFERENCED SINGLE-ENDED SIGNALING WITH ESD PROTECTION

BACKGROUND

The present disclosure relates to single-ended signaling.

Single-ended signaling is commonly used to transmit electrical signals over wires, such as those in contemporary memory systems. In single-ended signaling, a signal represented by a varying voltage is transmitted over a wire. The voltage varies above or below a reference voltage, which is used by a receiver of the signal to determine the digital values represented by the signal. In conventional single-ended signaling, the reference voltage is typically generated, either on-chip or off-chip, to be at the middle of a signal swing.

Conventional single-ended signaling typically has poor efficiency and limited speed. More specifically, conventional single-ended signaling has the disadvantage that (i) the reference voltage has to be generated for the receiver, (ii) it is difficult to match the reference voltage at the receiver with the reference voltage of the transmitter, (iii) noise such as simultaneous switching noise can be generated due to the use of a power supply voltage for signaling, and (iv) it is difficult to control a signal return path, resulting in crosstalk noise.

BRIEF DESCRIPTION OF THE DRAWINGS

The disclosure herein is illustrated by way of example and without limitation in the figures of the accompanying drawings and in which like reference numerals refer to similar elements and in which:

FIGS. 2A, 2B, 2C, 2D, 2E, and 2F illustrate embodiments of signal voltage supplies employed by the data transmission system of FIGS. 1A through 1D.

DETAILED DESCRIPTION OF EMBODIMENTS

The Figures and the following description relate to embodiments by way of illustration only. Alternative embodiments of the structures and methods disclosed herein may be employed without departing from the principles of the present disclosure.

Embodiments of the present disclosure include a data transmission system using a single-ended signaling system in which a signaling voltage is referenced to a reference voltage that is a power supply voltage shared by a transmitter and a receiver. The signaling voltage swings above and below the reference voltage. The reference voltage may be ground voltage, generally taken to be the lowest power supply potential. The signaling voltage is derived from a first signal supply voltage and a second signal supply voltage, which may be generated by a pair of charge pumps that draw substantially the same amount of current from a power supply, regardless of the output drive level of the transmitter.

FIGS. 1A, 1B, 1C, and 1D illustrate a data transmission system 100 employing supply voltage referenced single-ended signaling, according to one embodiment. The data transmission system includes first and second integrated circuit devices (ICs) 100a and 100b coupled to each other via a plurality of conducting lines including signal line 132. ICs 100a and 100b may be separate devices with separate IC packages, or combined within a die-stack or other multi-die package, or implemented by bare die. In the case of a multi-die package, the conducting lines may be implemented by intra-package conductors such as wire-bonds, flex conductors or any other suitable interconnection structures. In the case of separately packaged ICs or bare die, the conducting lines may be implemented partly by conductive structures for conveying signals (and establishing supply-rail connection) through the package to an external interconnect, and partly by printed circuit board (PCB) traces, PCB supply bus layers, flex cables or other conductive interconnects between the IC devices. With regard to system function, the ICs may be, for example and without limitation, a processor and chipset (or bridge or other application-specific IC (ASIC)), memory controller and memory device, or any other pair of ICs that carry out operations involving chip-to-chip signaling.

Figure 1A:
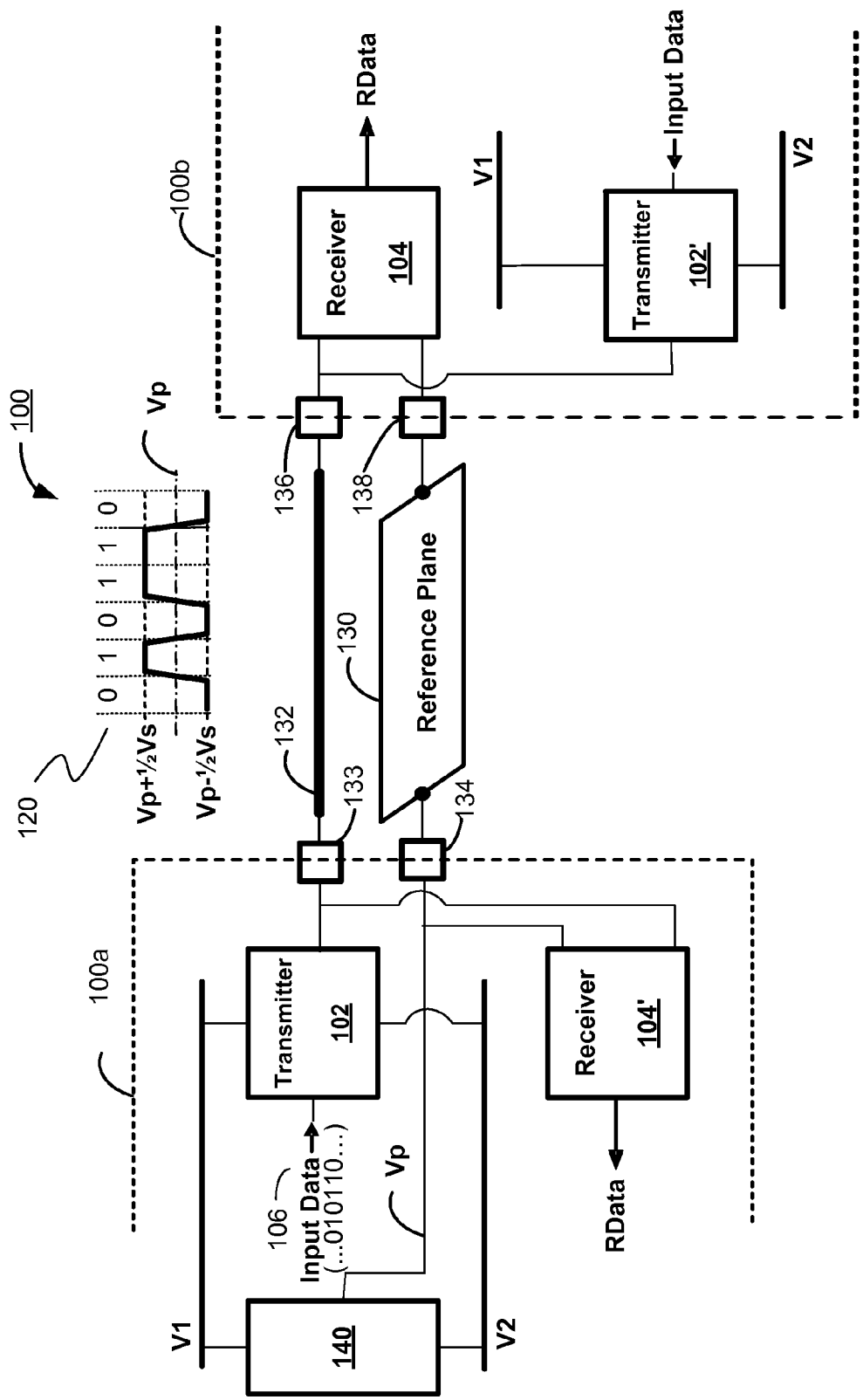
FIGS. 1A, 1B, 1C, and 1D illustrate a data transmission system employing power supply voltage referenced single-ended signaling, according to one embodiment.

Still referring to FIG. 1A, IC device 100a is to be connected to a power supply. IC device 100a includes a transmitter 102 and terminals (such as pads or pins) 133, 134. Transmitter 102 is coupled between two signal supply voltages V1 and V2, which are provided by one or more voltage sources 140. In one embodiment, V1 and V2 are substantially symmetrical with respect to a power supply voltage Vp associated with the power supply (i.e., V1−Vp=Vp−V2, at least approximately). Terminal 134 is coupled to a power supply rail 130 which is coupled to power supply voltage Vp, while terminal 133 is coupled to signal line 132. By this arrangement, when input data 106 is applied to transmitter 102, a signal that swings between about ½ V1 and about ½ V2 according to the input data 106 is output onto signal line 132 via terminal 133. Thus, transmitter 102 forms a voltage mode transmitter that generates a data signal 120 having a signal voltage that swings substantially symmetrically about the power supply voltage Vp (i.e., between about ½ V1 and about ½ V2) to convey the bits of the input data 106.

Because the transmitted signal swings symmetrically about the power supply voltage Vp, the power supply voltage may be used as a signaling reference voltage. In the embodiment shown, for example, the signal line 132 and the power supply rail 134 are coupled, via terminals 136 and 138, to respective inputs of a receiver 104 in circuit 100b. Receiver 104 amplifies the time-varying difference between the signal voltage and the power supply voltage to produce the received data signal (RData) that corresponds to the originally transmitted data 106. That is, receiver 104 compares the signal received via terminal 136 with the reference voltage supplied via terminal 138 to recover the transmitted signal and generate RData. For example, RData is "1" when the signaling voltage at terminal 136 is higher than the reference voltage at terminal 138, and RData is "0" when the signaling voltage at terminal 136 is lower than the reference voltage at terminal 138.

Bi-directional signaling may be effected by including in IC device 100b a transmitter 102' similar to transmitter 102 and in IC device 100a a receiver 104' similar to receiver 104. The reverse-direction transmitter/receiver 102'/104' may use the same signaling line 132 and/or the same supply-rail signaling reference 130 as transmitter/receiver 102/104 (thus driving signaling line 132 bi-directionally). Or, the reverse-direction transmitter/receiver 102'/104' may drive a separate signal line, and/or employ a separate or different supply-rail signaling reference. Also, while not specifically shown within FIG. 1A, a mesochronous or plesiochronous timing arrangement may be used to enable synchronous data transmission and reception over link 132. For example, a clock signal may be provided to both IC devices 100a and 100b (or forwarded from one device to the other) to provide timing for delivery of the input data 106 to the transmitter 102, and to provide timing for latching of the output of receiver 104 within an input data register or like storage circuit. Alternatively (or additionally), a source synchronous timing reference (e.g., a strobe signal that transitions to mark the presence of data on the signaling line 132) may be output from the transmitting IC to the receiving IC to control the signal sampling time within the receiving IC. Various timing vernier circuitry may be provided and calibrated to establish data output timing and/or data sample timing within desired margins.

In one embodiment, the V1/V2 signaling supply voltages are selected to effect a small signal swing Vs (e.g., Vs≈½(V1−V2) is substantially lower than corresponding on-chip logic levels) and thereby enable low-power signaling. The signaling supply voltages may be driven to programmably selected or designed setpoint voltages (as discussed below), or may be adaptively established or calibrated to achieve a threshold operating margin as determined by bit error rate or other signal quality metric.

Charge-pump-based voltage supplies or any other supply voltage circuits or voltage regulators may be used to implement the one or more voltage sources 140, as discussed in more detail below. In one embodiment, for example, the voltage source(s) 140 is designed such that signal supply voltages are regulated and the net current drawn by transmitter 102 from the power supply remains substantially constant regardless of the output voltage level at terminal 133, thereby reducing switching noise within the signaling system.

The signaling arrangement of FIG. 1A provides a number of benefits relative to conventional approaches. First, the power supply rail 130 may be implemented as a continuous conducting plane (e.g., power plane) that underlies all or most of the signal lines within an IC package or PCB, and thus constitutes a low and sometimes lowest impedance network in the signaling system 100. Consequently, by coupling the reference output terminal 134 of transmitter 102 and the reference input terminal 138 of receiver 104 to this low impedance reference node (the power plane) 130, a stable, consistent reference level may be ensured between various components of the signaling system, including transmitter 102 and receiver 104.

Another advantage of signaling system 100 is that, as discussed below with reference to FIG. 1C, a signal current sourced by transmitter 102 flows over signaling line 132 to receiver 104 and then returns to transmitter 102 on power plane 130 via a path substantially parallel to the signaling line 132. Thus, the return current may flow anti-parallel to the signal current, and the signal current and signal-return connections at the chip level are essentially differential. Consequently, noise and cross-talk that would otherwise be generated by return current flow that is not parallel to the signal current flow can be avoided. Altogether, the various benefits of the above-described signaling arrangement enable construction of a high-speed, ultra-low-power single-ended signaling system that requires on the order of 1 mW of signaling energy from the power supply—roughly 10-20 times lower than that of a conventional single-ended signaling system.

Figure 1B:
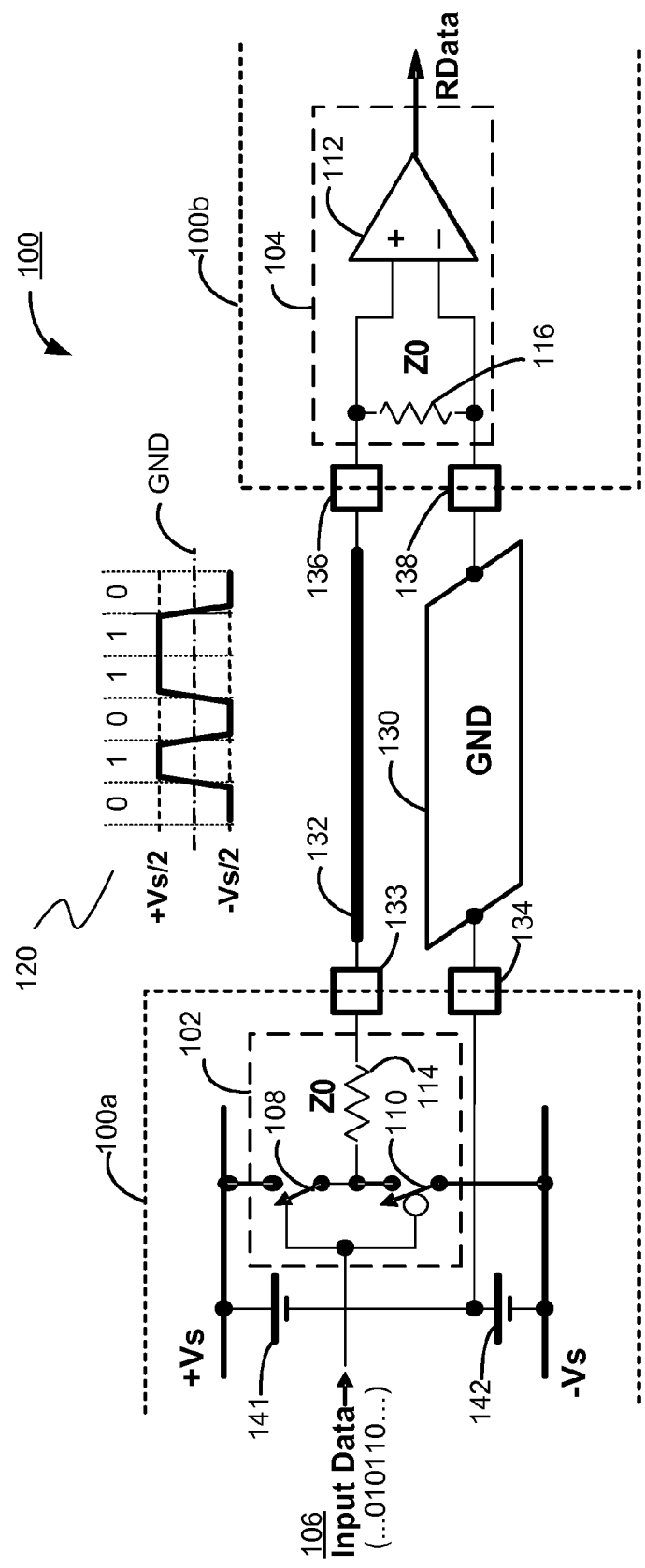

FIG. 1B illustrates an embodiment where a ground plane is used as power supply rail 130, so that V1=+Vs and V2=−Vs. Voltage source(s) 140 is shown as comprised of a voltage source 141 that provides +Vs and a voltage source 142 that provides—Vs. Transmitter 102 may include signal-controlled switching elements 108, 110 each coupled between a common drive node and respective signal supply voltages, +Vs and −Vs. Transmitter 102 further includes a resistive element 114 coupled between the common drive node and terminal 133 to act as a series source termination (e.g., to match a characteristic impedance, Z0, of the signal line). Thus the transmitter's internal Z0 impedance 114 and the impedance of the line 132, terminated at Z0 by termination impedance 116, form a voltage divider that splits the two supply voltages, so that the signaling voltage of signal 120 on line 132 toggles between about +Vs/2 and −Vs/2, as shown in FIG. 1B. In some embodiments, the functions of switches 108, 110 and resistor 114 may be combined in a single device, for example an MOS field effect transistor (MOSFET) operating in the linear or "triode" region of operation; in such embodiments, the linear relationship of the voltage between the drain and source terminals of the MOSFET and the current flowing between drain and source causes the device to operate in a mode approximating a resistor.

Still referring to FIG. 1B, receiver 104 may include a differential amplifier or other comparator circuit 112. Amplifier 112 amplifies the time-varying difference between the ground rail and signal potentials to produce the received data signal (RData) that corresponds to the originally transmitted data 106. As shown, a termination element (depicted as resistive element 116) may be coupled between the input nodes 136 and 138 to terminate the incoming signal line according to the characteristic impedance, Z0.

Figure 1C:
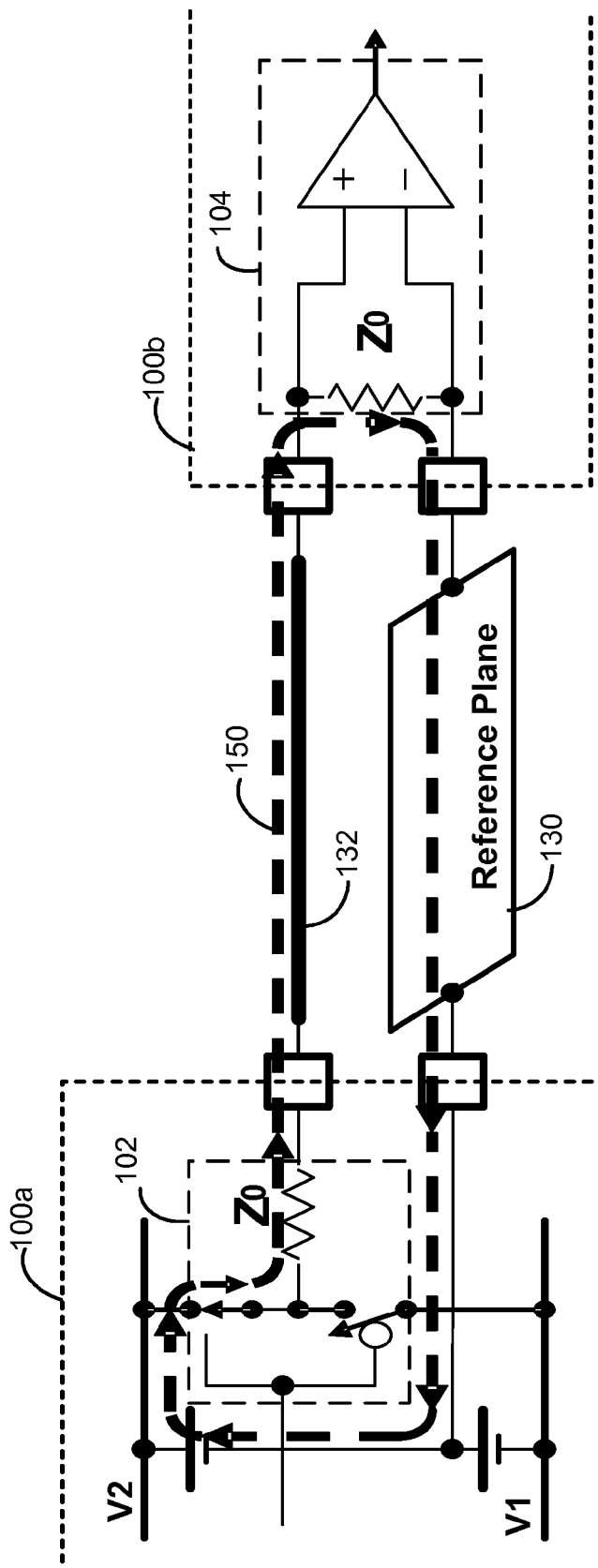

Referring now to FIG. 1C, a signal current 150 sourced by transmitter 102 flows over signaling line 132 to receiver 104 and then returns to transmitter 102 on ground plane 130 via a path that can be made substantially parallel to the signaling line 132. Thus, noise and cross-talk that would otherwise be generated by return current flow not parallel to the signal current flow can be reduced or eliminated.

Figure 1D:
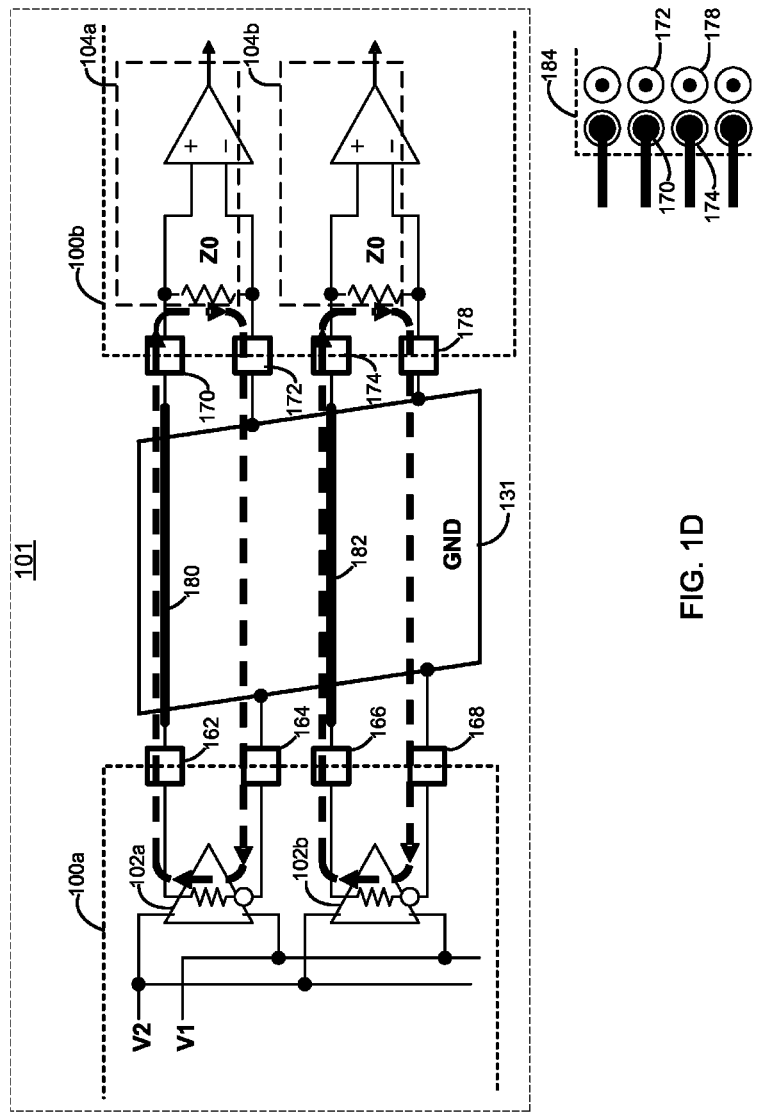

In one embodiment, IC devices 100a and 100b include IC chips within respective semiconductor packages 184 each having an array of solder balls or other metal contacts that act as terminals for the IC devices. FIG. 1D illustrates IC devices 100a and 100b on a PCB 101, according to one embodiment. FIG. 1D shows two signaling lines 180, 182 between circuits 100a, 100b, as a subset of a plurality of signaling lines that would be present on the PCB 101 between circuits 100a and 100b. IC device 100a includes a plurality of transmitters, including transmitters 102a, 102b. IC device 100b includes a plurality of receivers, including receivers 104a, 104b. IC devices 100a and 100b include a plurality of reference (GND) terminals 164, 168 and 174, 178, respectively, that are coupled to a power plane (e.g. ground plane) 131 of the PCB 101. The power plane 131 of the PCB 101 can be a solid metal layer in the PCB 101, a metal layer with windows or holes, or it can include a plurality of conducting lines each coupled to a same power supply voltage. Although FIG. 1D shows that power plane 131 is between IC devices 100a and 100b, in practice, power plane 131 may extend under IC devices 100a and 100b.

IC devices 100a and 100b further include a plurality of signaling terminals 162, 166 and 170, 174, respectively. To facilitate routing of the signaling lines, the solder balls acting as or coupled to the signaling terminals 162, 166 and 170, 174 can be placed closer to the edge of the respective semiconductor packages 184 than the solder balls acting as or coupled to the reference (e.g., GND) terminals 164, 172 and 168, 178. For example, in the IC packaging 184 of circuit 100b (as shown by the insert in FIG. 1D), the signaling terminals 170, 174 are placed as outer balls of the IC packaging 184 to facilitate easy connection of the balls to the signaling lines 180 and 182 outside the IC package. On the other hand, the reference terminals 172, 174 can be connected to the inner balls of the IC packaging 184, because they only need to be coupled to a power plane (e.g., GND plane) within the package, which is coupled to the power plane 131 of the PCB 101, to which the package is soldered or otherwise attached. Such ground package pins 172, 178 are not as expensive as signal pins 170, 174, since they are connected directly through vias to a solid conducting plane, thereby requiring no trace routing. Also, although FIG. 1D illustrates that separate reference (e.g., GND) terminals 164, 172 and 168, 178 are used for each of the corresponding signaling terminals 162, 170 and 166, 174, it is also possible for two or more of the signal pins 162, 166 and 170, 174 to share a common reference terminal, thereby further reducing the number of package pins needed for the reference pins.

Figure 1E:
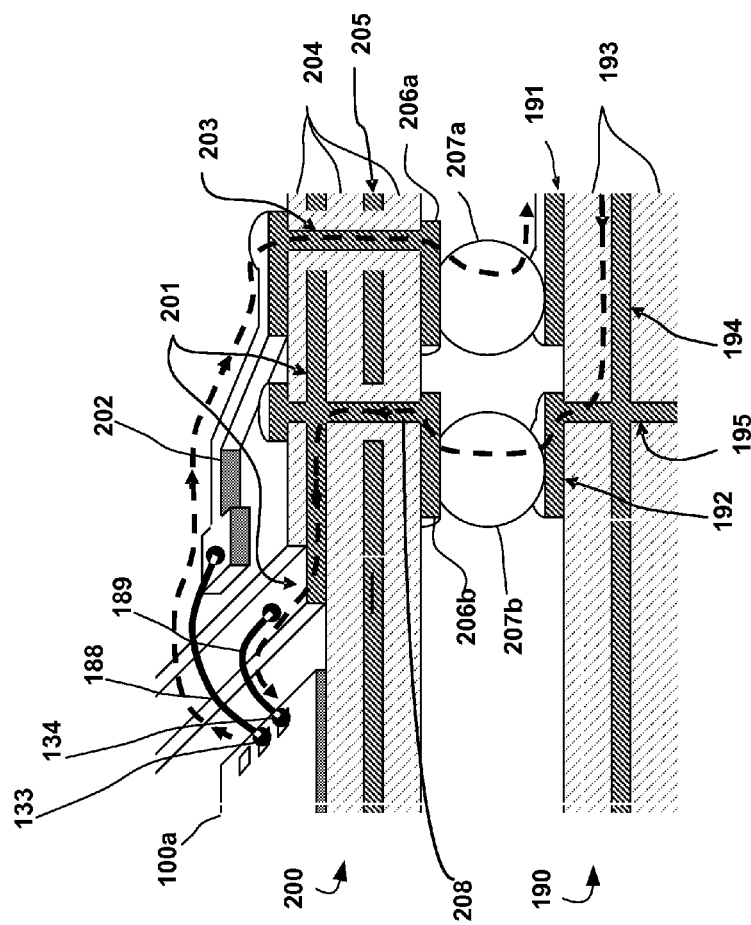
FIGS. 1E and 1F illustrate a cutaway view of an IC package including an integrated circuit of the data transmission system of FIGS. 1A through 1D on a printed circuit board.

FIG. 1E illustrates a cutaway view of an IC package including IC device 100a (or IC device 100b) on a printed circuit board. According to one embodiment, referring to FIG. 1E, IC device 100a is mounted on a laminated IC package substrate 200. Package substrate 200 is a multi-layer package substrate having signal wiring conductive layers, including a top layer (e.g., signal trace 202) and a bottom layer (e.g., solder-ball pads 206a and 206b). Package substrate may also include additional conducting layers separated from each other and from the top and bottom layers by insulating layers 204. The additional layers may used for power delivery and signal return current conduction. For example, layer 201 in FIG. 1E may be a signal return (and/or reference) plane for the previously described single-ended signaling system, while layer 205 may be a plane used to connect to some other power supply voltage. In one embodiment, reference plane 201 corresponds to the ground reference plane 130 of FIG. 1B (i.e., coupled to an external ground reference) and is sometimes referred to as ground plane 201 below. In alternative embodiments, reference plane 201 may be coupled to another DC reference or even a time-varying reference.

Still referring to FIG. 1E, integrated circuit package 200 may be attached both electrically and mechanically to printed wiring board 190 via an array of solder balls, including solder balls 207a and 207b. Printed wiring board 200 may be constructed similarly or identically to laminated package substrate 200, with surface conducting layers, such as layer 191, inner conducting planes, such as plane 194, and perhaps additional internal signal layers and power supply planes, that are separated from each other by insulating layers 193.

Still referring to FIG. 1E, IC device 100a includes one or more instances of ground-referenced signaling receivers and transmitters, such as 102 and 104' in FIG. 1A. The output pads of these units (corresponding to 133 and 134 in FIG. 1A) are connected to conducting traces and planes on package 200 via wire bonds 188 and 189, respectively. In FIG. 1E, the signal terminal 133 is connected to package trace 202 via wire-bond 188. Signal current, denoted by the dashed lines, flows from the chip 100a, through wire-bond 188 to package trace 202, thence to through-package via 203, where it is carried to the bottom layer of the package to solder-ball pad 206a. Signal current further flows through solder ball 207a to printed wiring board solder-ball pad and signal trace 191, and from there to another packaged integrated circuit such as IC device 100b. Return current (also shown by a dashed line) flows back from the second packaged integrated circuit over a power supply plane 194, to via 195, where it is conducted up to solder-ball pad 192, through solder ball 207b, through solder-ball pad 206b and via 208 to the on-package conducting ground plane 201. The electromagnetic interaction between the signal current and this return current will tend to cause the return current to flow in plane 201 in a manner anti-parallel to the signal current in signal trace 202 (i.e., reverse-direction current flow in a path parallel to the signal trace 202), finally reaching integrated circuit 100a through wire bond 189. In one embodiment, the solder balls 207a/207b, solder-ball pads 206a/206b, and through-package vias 203, 208 that carry the signal current and return current are disposed in close proximity. The close proximity of the solder balls, solder-ball pads, and through-package vias that carry the signal current and return current help avoid large series inductances from accumulating in the overall signal path, and thus further reduces or eliminates cross-talk with neighboring signals and their return currents.

FIG. 1E is shown merely by way of example, as there are many other ways of implementing an integrated circuit package and printed wiring boards, including, but not limited to "flip-chip" (C4) construction, package-on-package (POP), and other packaging constructions. Although the technology used and the configuration of the package may vary, the following features should preferably be maintained for optimal performance: (1) the use of a common, low-impedance power supply conducting plane (e.g., power supply conducting plane) that carries all return currents from one or more supply-reference single-ended signaling components (i.e., transmitters and receivers); and (2) provision for a separate path from the conducting plane to the reference terminals of both transmitters and receivers (e.g., pins 134 and 138 in FIG. 1A), which path may include, for example and without limitation, board and package conducting planes, solder balls, through-package and through-board vias, wire bonds, and C4 solder bumps. Furthermore, to the extend the extent permitted by the packaging construction technique, the signaling system may also include an arrangement that forces the signal return current to flow anti-parallel to the corresponding signal current, while not overlapping with the signal current return path of other signaling components.

Figure 1F:
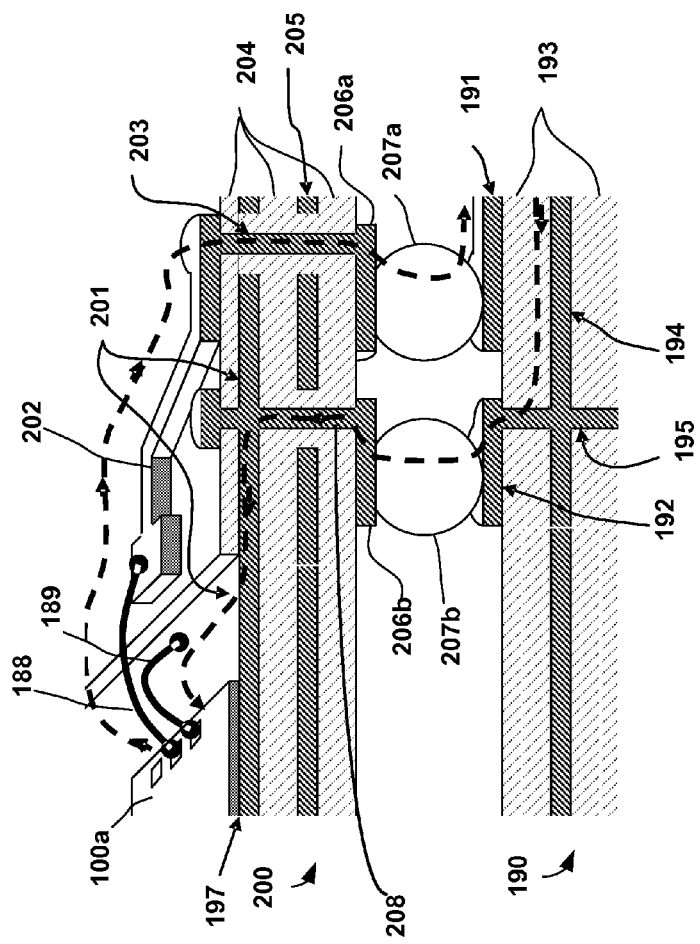

FIG. 1F illustrates yet another packaging embodiment, similar to the embodiment of FIG. 1D (and including all the variants mentioned above), but in which the ground plane 201 extends beneath the IC die 100a. In the embodiment shown, the IC die 100a is insulated from the ground plane by a relatively thin layer of epoxy 197. Other insulating materials may be used in alternative embodiments. This approach generally provides all the benefits of the arrangement of FIG. 1E while maintaining the presence of the ground plane 201 beneath the IC die and thus providing potentially superior shielding and noise suppression.

Figure 2A:
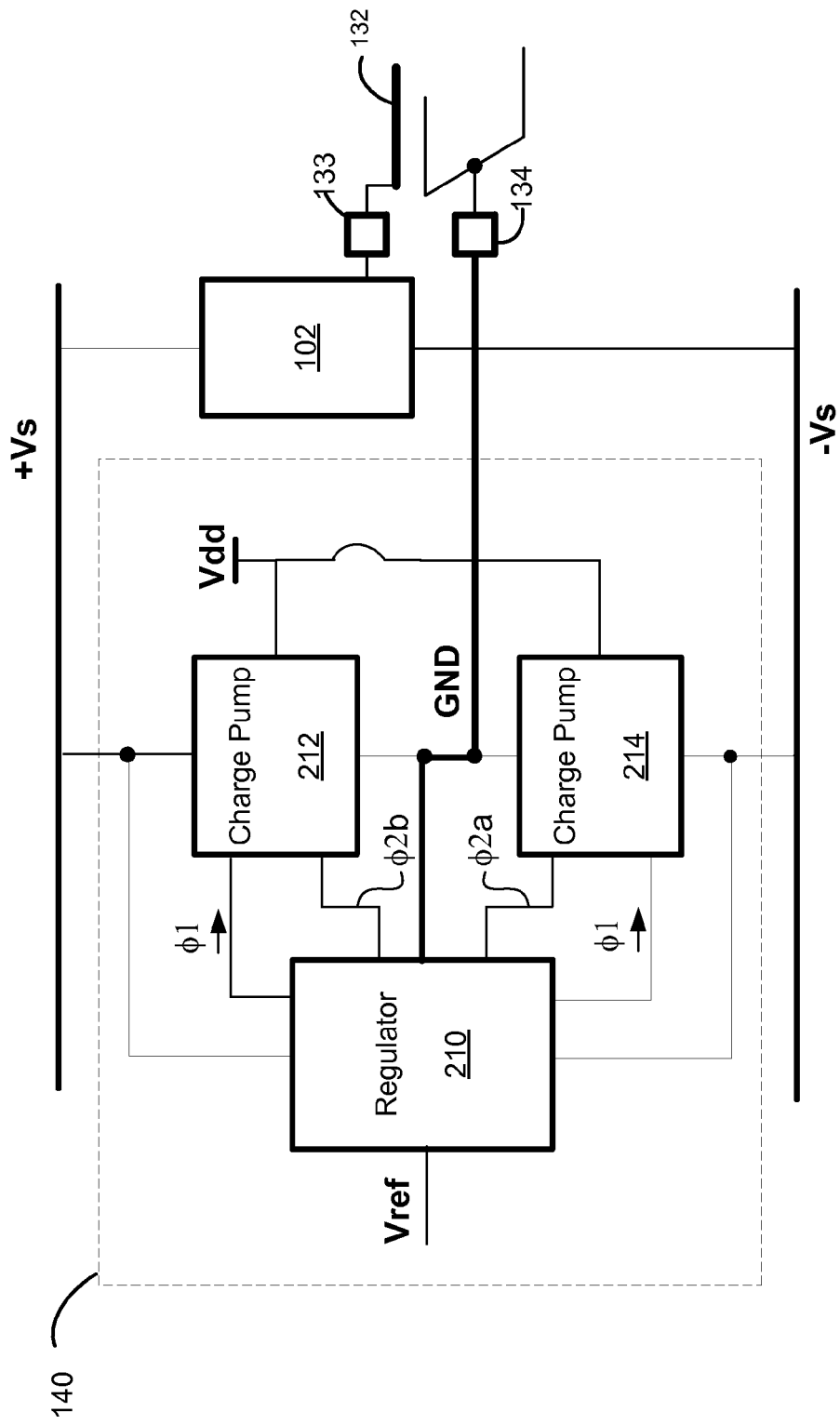

FIG. 2A illustrates one embodiment of the voltage source(s) 140. As shown in FIG. 2A, voltage source(s) 140 includes charge pumps 212 and 214 for generating the signal supply voltages +Vs and −Vs, respectively, and a charge pump regulator 210. Regulator 210 is coupled to the signal supply voltages +Vs and −Vs, and receives a reference voltage Vref that represents a desired voltage level for Vs. It controls or regulates the charge pumps 212 and 214 using control signals φ2b and φ2a, respectively. Charge pumps 212 and 214 are each coupled between first and second power supply voltages (e.g., Vdd and GND), and are configured to draw current from the power supply to provide the signal supply voltages +Vs and −Vs, and to maintain the signal supply voltages +Vs and −Vs at desired levels in response to control signal φ1 and to control signals φ2b and φ2a, respectively.

Figure 2C:
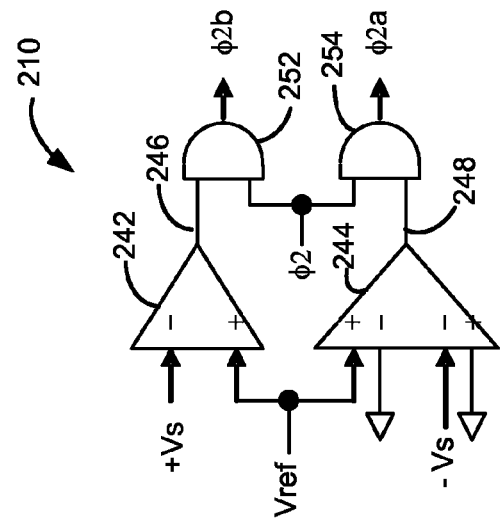
Figure 2B:
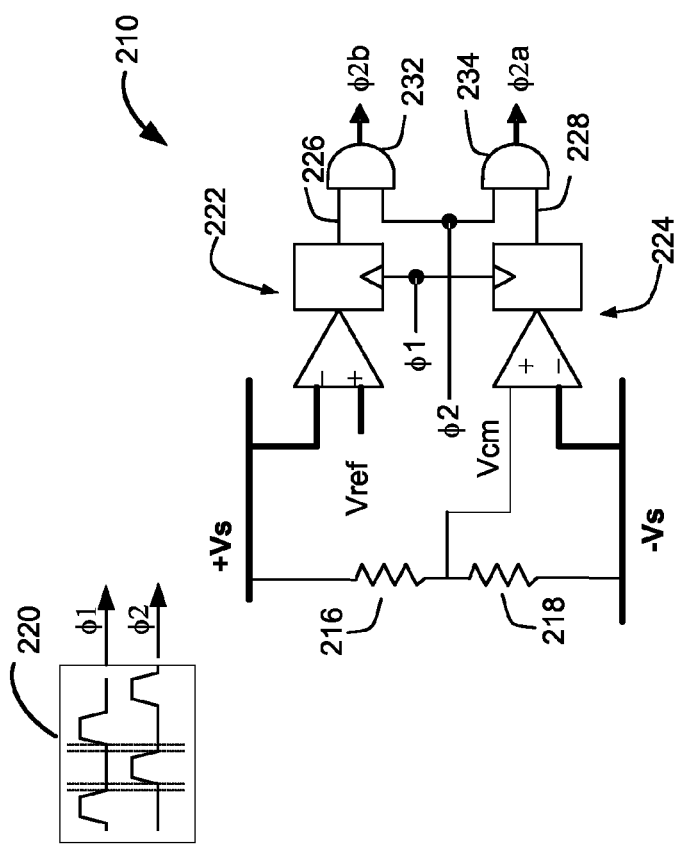

FIG. 2B illustrates an embodiment of regulator 210. As shown in FIG. 2B, regulator 210 receives a pair of non-overlapping clocks φ1 and φ2 (or, it may include a clock signal source 220 that generates the pair of non-overlapping clocks φ1 and φ2). A pair of equally sized resistors 216 and 218 divides a voltage difference between +Vs and −Vs to produce a voltage Vcm (a common-mode voltage between the positive and negative signal supply voltages). The signal supply voltages +Vs and −Vs are nominally symmetric about GND. A digital or "bang-bang" control loop including sense amplifier/latch 224 amplifies the difference (error) voltage between Vcm and GND. When the voltage on Vcm is higher than the voltage on GND, a signal on line 228 is asserted, and during the following φ2 interval, AND gate 234 outputs signal φ2a that tracks signal φ2 (i.e., signal φ2a is asserted if signal φ2 is asserted). On the other hand, if the voltage on Vcm is lower than the voltage on GND, sense amplifier/latch 224 amplifies this difference and de-asserts the signal on line 228, such that φ2a is not asserted.

Likewise, digital or "bang-bang" control loop including sense amplifier/latch 222 that amplifies the difference (error) voltage between +Vs and Vref. If the voltage on +Vs is lower than the voltage Vref, a signal on line 226 is asserted, and during the following φ2 interval, AND gate 232 outputs signal φ2b that tracks signal φ2 (i.e., signal φ2b is asserted if signal φ2 is asserted). On the other hand, if the voltage +Vs is higher than the voltage Vref, sense amplifier/latch 222 amplifies this difference and de-asserts the signal on line 226, such that φ2b is not asserted. By asserting and deasserting φ2a and φ2b based on comparison of Vcm with GND and +Vs with Vref, respectively, the signal supply voltages +Vs and −Vs can be maintained at the desired levels, as discussed below.

FIG. 2C illustrates another embodiment of regulator 210. Here, the signal supply voltage +Vs is fed back into comparator 242 for comparison with the reference voltage Vref. The output 246 of comparator 242 is asserted if +Vs is smaller than Vref. Thus, the output φ2b of AND gate 252 follows the clock signal φ2 when +Vs is lower than Vref and is not asserted otherwise. Likewise, the signal supply voltage −Vs is fed back into window comparator 244 for comparison with the reference voltage Vref. The output 248 of window comparator 244 is asserted if the difference between GND and −Vs is smaller than the difference between Vref and ground (i.e., GND−(−Vs)<Vref−GND, or Vs is smaller than Vref). Thus, the output φ2a of AND gate 254 follows the clock signal φ2 when the difference between GND and −Vs is smaller than the difference between Vref and GND. Otherwise, it is not asserted.

FIGS. 2D and 2E illustrate embodiments of charge pumps 212 and 214, respectively. Referring to FIG. 2D, charge pump 212 includes a switching device 262 (shown as a P-type metal-on-semiconductor (MOS) field effect transistor (PFET)) that is turned on or off according to clock signal φ1, and a switching device 264 (shown as an N-type MOS field effect transistor (NFET)) that is turned on or off according to clock signal φ2b. Charge pump 212 further includes a capacitor 266 and a capacitor 268. Capacitor 266 has a much smaller capacitance than that of capacitor 268 and is therefore sometimes referred to as Csmall, while capacitor 268 is sometimes referred to as Cbig. Cbig 268 is coupled between +Vs and GND, so the voltage across capacitor 268 is the signal supply voltage +Vs.

FIG. 2F is timing chart showing signals φ1, φ2, φ2b, the voltage across capacitor 266 (V_Csmall), and the voltage across capacitor 268 (+Vs) in comparison with Vref during a series of time periods after IC device including the charge pumps is turned on. As shown in FIG. 2F, during time period t1, when φ1 is asserted, switch 262 is turned on, allowing charge to flow from Vdd to capacitor 266, so that a voltage across capacitor 266, V_Csmall, increases to a level between Vdd and GND. The voltage across Cbig is lower than Vref so φ2b is tracking φ2. During time period t2, when φ1 is de-asserted while φ2 and thus φ2b is asserted, switch 262 is turned off while switch 264 is turned on, so that stored charge in Csmall is shared with Cbig and the voltage across capacitor 268, +Vs, increases while V_Csmall decreases.

Since the capacitance of Csmall is much smaller than the capacitance of Cbig, and the increase in voltage across Cbig during time period t2 is much smaller than the decrease in voltage across Csmall, so the voltage across Cbig at the end of time period t2 is slightly higher than the voltage across Cbig at the start of time period t2. The above charging of Csmall and subsequent charging of Cbig may repeat in response to signals φ1 and φ2b, until the signal supply voltage +Vs reaches or is higher than Vref at the end of time period t3. As discussed above, as long as +Vs remains at or above Vref during time periods t4 and t4, φ2b is not asserted, meaning switch 264 does not turn on and Cbig does not get further charged by Csmall. When +Vs drops below Vref during time period t6, φ2b follows φ2 again in time period t7, and charges from Csmall will be shared with Cbig until +Vs is higher than Vref again.

The signal and voltage curves shown in FIG. 2F are for illustrative purposes only and are not to replicate or scale with signals or voltages in a real IC device. In some embodiments, the voltage between Vdd and GND is much higher than Vref. For example, Vdd may be about 1 volt, while Vref is about 0.1 volt. In such case, if the charge pumps run at a frequency of, for example, 1 GHz, data is being driven out at, for example, 4 Gbps, and the impedance of transmitter 102 (thus the impedance of the load) is, for example, 50 ohms, Csmall can be about 0.75 pF to about 1.25 pF while Cbig can be about 50 pF to about 250 pF.

On the other hand, charge pump 214 includes switches 272, 282 that are turned on or off according to clock signal φ1, and switches 274, 284 that are turned on or off according to clock signal φ2a. Charge pump 214 further includes a capacitor Csmall 276 and a capacitor Cbig 278. Cbig 278 is coupled between GND and −Vs so the voltage across Cbig 278 is the signal supply voltage −Vs. Switches 272, 282 are turned on when clock signal φ1 is asserted so that charge is extracted from power supply Vdd via switch 272 and 282 and stored in capacitor Csmall 212. Switches 274 and 284 are turned on when signal φ2a is asserted and signal φ1 is de-asserted, so charges stored in Csmall is pumped into Cbig. This process repeats until the common mode voltage Vcm is lower than GND, or the difference between GND and Vs is larger than the difference between Vref and GND. As discussed above in association with FIGS. 2B and 2C, as long as the common mode voltage Vcm remains lower than GND, or the difference between GND and Vs remains larger than the difference between Vref and GND, φ2a remains de-asserted and no charge is pumped from Csmall 276 to Cbig 278 to further increase the voltage across Cbig 278. When the common mode voltage Vcm becomes higher than GND, or the difference between GND and Vs becomes smaller than Vref, φ2a follows φ2 again and Cbig 278 gets charged from Csmall until Vcm becomes lower than GND, or the difference between GND and Vs becomes larger than the difference between Vref and GND again.

FIGS. 2D and 2E shows that switches 262 and 272 are implemented using P-type metal-oxide-semiconductor field effect transistors (P-MOSFET or PFET), while switches 264, 274, 282 and 284 are implemented using N-type MOSFETs (NFET). PFET 262 or 272 is turned on when φ1 is asserted by virtue of inverter 260 or 270, respectively, which inverts the sense of φ1 to drive the gate terminal of PFET 262 or 272. Those skilled in the art will easily understand that other types of switches can be used in place of the MOSFETs. The capacitors 266, 268, 276, and 278 may be implemented using MOS capacitors, but other types of capacitors can alternatively be employed.

The embodiments of FIGS. 2A through 2F are shown by way of examples. There are many other possible embodiments of on-chip voltage sources or regulators. For example, some embodiments may have additional Csmall capacitors and additional switches that charge these Csmall capacitors in a series circuit arrangement and discharge the Csmall capacitors in a parallel arrangement, thereby providing higher overall efficiency than that of the simple charge pumps of FIGS. 2D and 2E. In a further example, instead of using clocks to gate the MOSFETs on and off in the charge pumps, other type of switches that respond to other characteristics of control signals such as frequency, amplitude or duty cycle of the control signals may be used. In yet another example, switched capacitors may be used in place of the switch and capacitor combinations in the charge pumps. In still other examples, other regulating means such as a linear regulator or switching regulator may be used to control the signal supply voltages.

In one embodiment, charge pumps 212 and 214 are implemented with components having substantially the same efficiency. In the embodiment shown in FIG. 2A, charge pump 212 draws current from Vdd when transmitter 102 is transmitting "1"s while charge pump 214 draws current from Vdd when transmitter 102 is transmitting "0"s. Thus, assuming that the transmitter 102 has matching impedance with the transmission lines 132, 130, the transmitter 102 draws approximately the same amount of supply current from the power supply regardless of which way the transmitter 102 is driving the current (i.e., sourcing current from transmitter 102 to receiver 104, or sinking current from receiver 104 to transmitter 102). Thus, to the extent that charge pumps 212 and 214 have about the same efficiency, the complementary configuration of the voltage source(s) 140 ensures that supply current variation in signaling system 100 is near zero, thereby reducing or eliminating simultaneous switching noise (SSO) inherent in conventional single-ended signaling schemes.

Figure 3B:
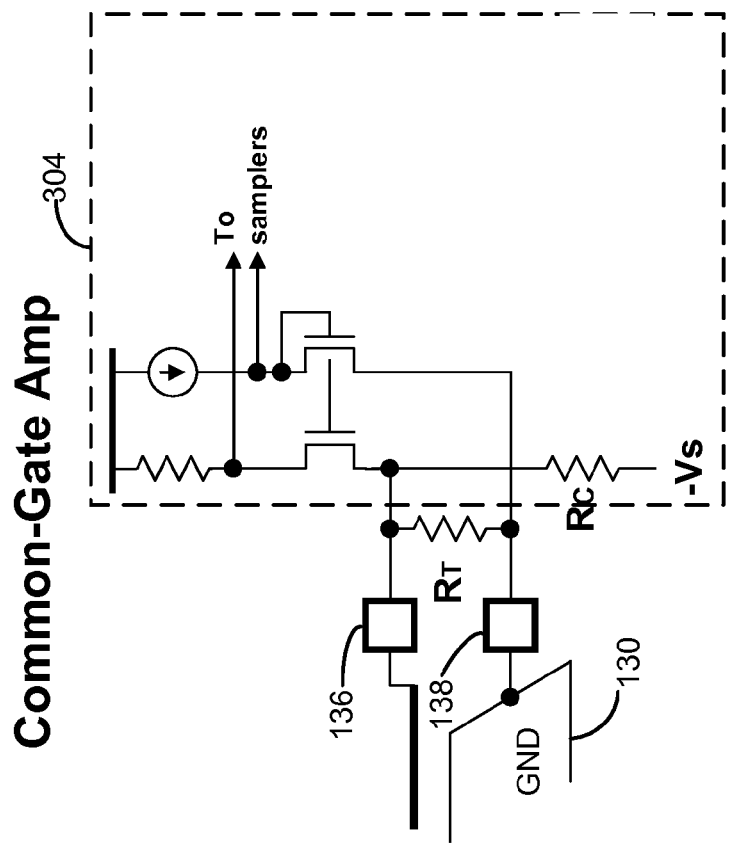
FIGS. 3A and 3B illustrate receiver amplifiers suitable for use in the data transmission system of FIGS. 1A through 1D, according to one embodiment.
Figure 3A:
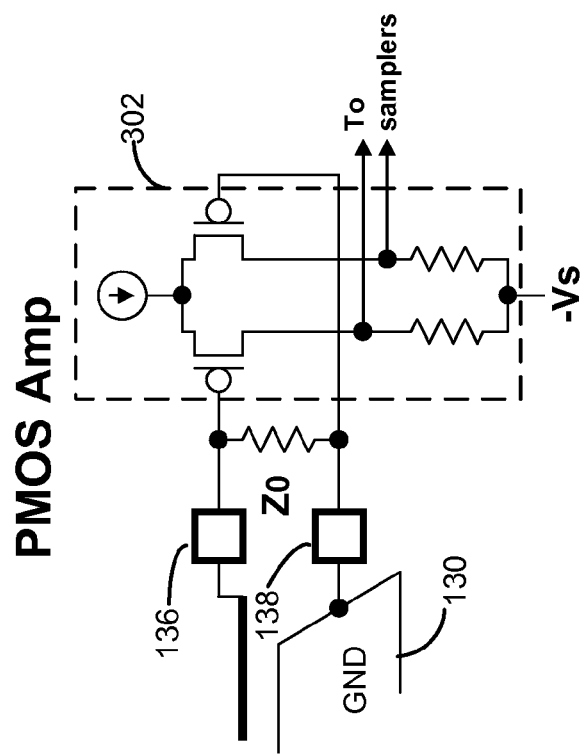
Figure 3C:
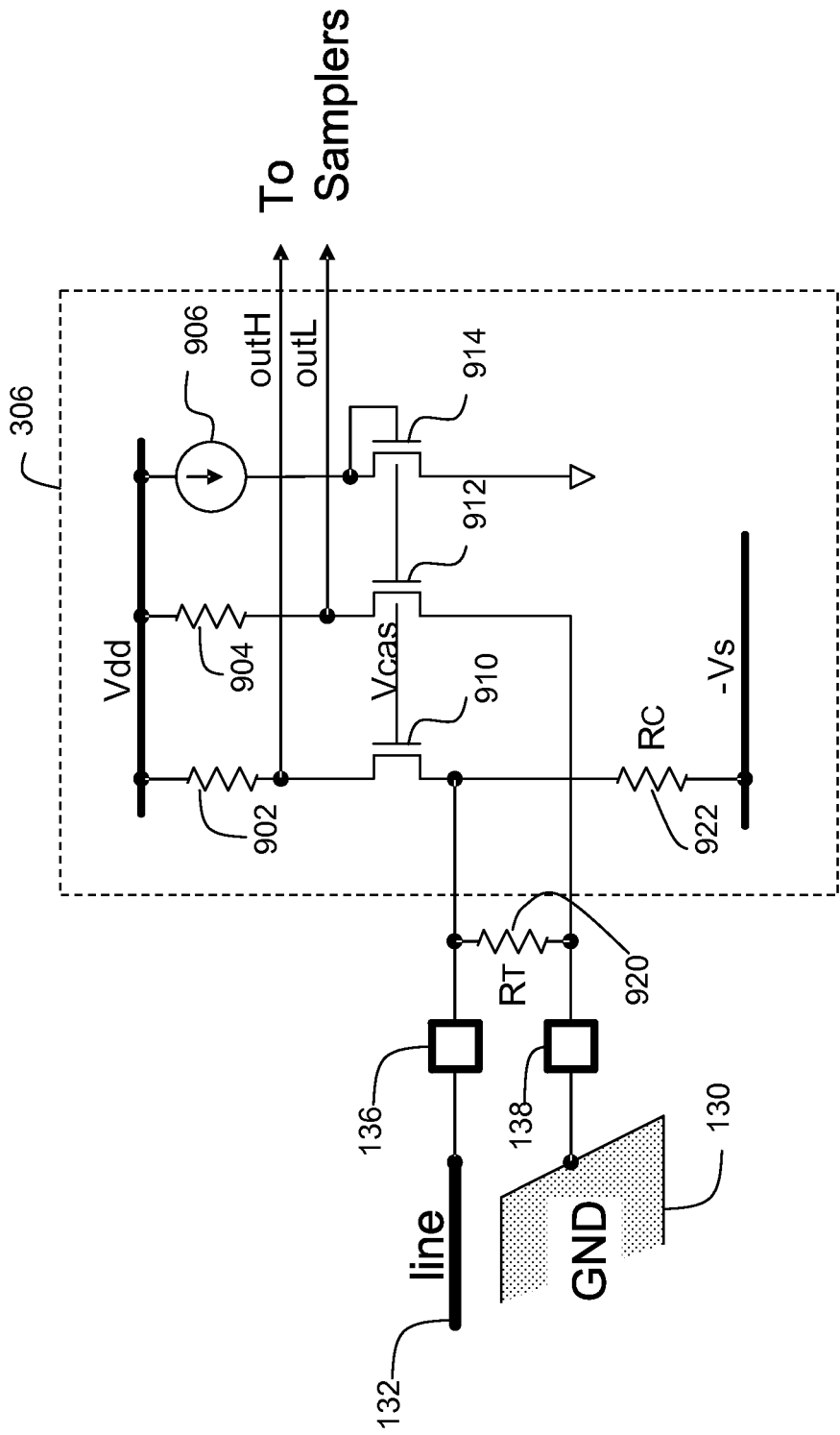
FIG. 3C is an alternative embodiment of a common-gate amplifier of FIG. 3B.

FIG. 3A, 3B, and 3C illustrate several alternative embodiments for the receiver amplifiers used in the data transmission system 100 of FIGS. 1A, through 1D, when the GND is chosen as the reference voltage, according to one embodiment. FIG. 3A illustrates a PMOS amplifier 302 that can be used in some embodiments of receiver 104, coupled to the two terminals 136, 138 corresponding to the signaling voltage and GND reference voltage, respectively. This amplifier is a conventional PMOS differential amplifier with resistor loads. Numerous alternative embodiments of a PMOS differential amplifier are possible. FIG. 3B illustrates one embodiment of a common gate amplifier 304 that can be used in receiver 104 in other embodiments, coupled to the two terminals 136, 138 corresponding to the signaling voltage and GND reference voltage, respectively. The common gate amplifier 404 in FIG. 3B is implemented with NMOS transistors and thus may have a higher gain-bandwidth product than the PMOS amplifier 402 of FIG. 3A.

FIG. 3C is a common-gate amplifier 306 according to another alternative embodiment. Current source 906 establishes a reference current in NFET 914, thereby generating gate reference voltage Vcas. NFETs 910 and 912, which are the amplifying transconductances in amplifier 306, are drawn at the same shape factor (width/length) as 914 so that they carry about the same current as 914, when their inputs, driven into their source terminals, attached to pins 136 and 138, are at substantially the same potential, since in this case the gate-to-source voltages (Vgs) for all three transistors are substantially equal and the shape factors are identical. The data signal, attached to pin 136, is compared in amplifier 306 with the signal reference voltage, input on pin 138 from the power supply GND plane 130. The current from line to GND develops a voltage across termination resistor 920; this voltage swings from about +Vs/2 to −Vs/2. When the voltage on line (pin 136) is higher than the voltage on GND (pin 138) NFET 910's Vgs is less than Vgs at NFET 912. Therefore, less current flows through 910 and through 912, and the voltage drop through load resistor 902 is smaller than the voltage drop through load resistor 904. This causes the voltage on outH to rise above the voltage on outL. On the other hand, if the voltage on 136 is lower than the voltage on 138, then NFET 910's Vgs is greater than Vgs for NFET 912. Consequently NFET 910 carries more current than 912, and the voltage across 902 is larger than the voltage across 904. In this case, the voltage on outH is less than the voltage on outL. Under these circumstances the current driven back into line 132 (pin 136) by NFET 910 is larger than the current driven into the line 132 by 910 when the voltage on line exceeds the voltage on GND. To prevent this current unbalance from introducing an unwanted voltage offset in amplifier 306, a compensating resistor 922, RC, is used to return some of the current to the negative power supply −Vs.

Still referring to FIG. 3C, the magnitude of the voltage between outH and outL is higher than the magnitude of the voltage between line (pin 136) and GND (pin 138) thanks to the gain of amplifier 306; the gain of 306 is about Gm×RL, where Gm is the transconductance of NFETs 910 and 912, and RL is the resistance of load resistances 902 and 904.

Still referring to FIG. 3C, it will be clear to those skilled in the art, that the terminating impedance presented across pins 136 and 138 is the parallel combination of the terminating resistor RT 920, the compensating resistor RC 922, and the input impedance of the amplifier, which is about 1/Gm, where Gm is the transconductance of transistors 910 and 912. This parallel combination of resistances should be adjusted to about the characteristic impedance of the transmission line formed by line 132 and GND to avoid reflections in the transmission line.

The foregoing embodiments of input amplifiers are shown by way of examples. Many alternative embodiments of input amplifiers can be employed in receiver 104 or 104' in system 100.

Figure 4A:
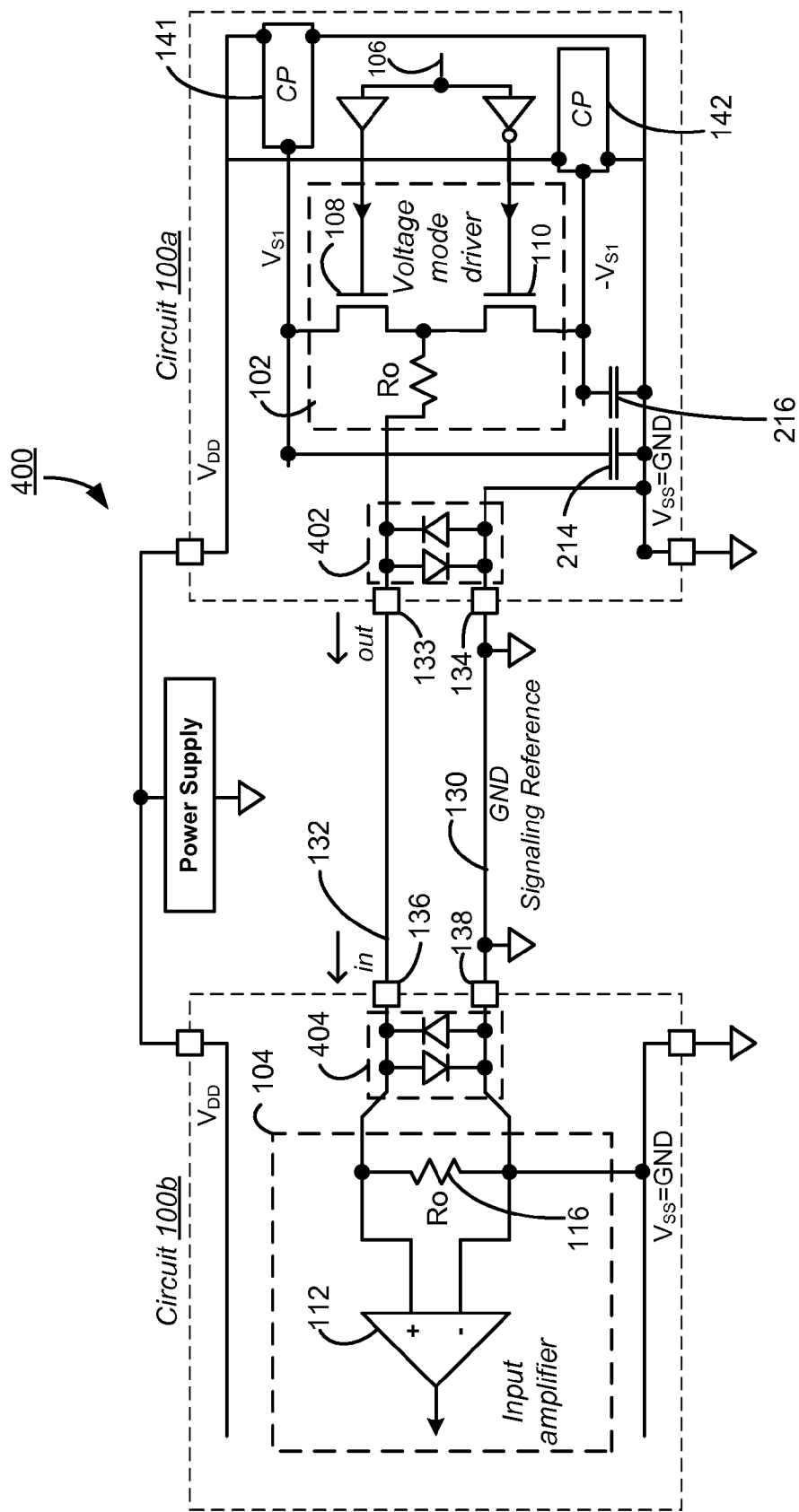
FIG. 4A illustrates a data transmission system employing ground-referenced single-ended signaling with ESD protection, according to one embodiment.

FIG. 4A illustrate a data transmission system employing GND referenced single-ended signaling with ESD protection, according to one embodiment. The data transmission system 400 includes circuit 100a including the transmitter 102 and circuit 100b including the receiver 104, and employs the single-ended signaling scheme as described above using the signaling line 132 and GND reference line 130. Voltage sources such as charge pumps (CP) 141, 142 supply the positive and negative signal supply voltages $V_{S1}$ and $-V_{S1}$, and either switch 108 or switch 110 is turned on to source or sink line current on the signaling line 132 responsive to input data 106, as explained above. The signaling voltage is developed across resistor 116 and detected by input amplifier 112 to recover the input data 106.

Figure 4B:
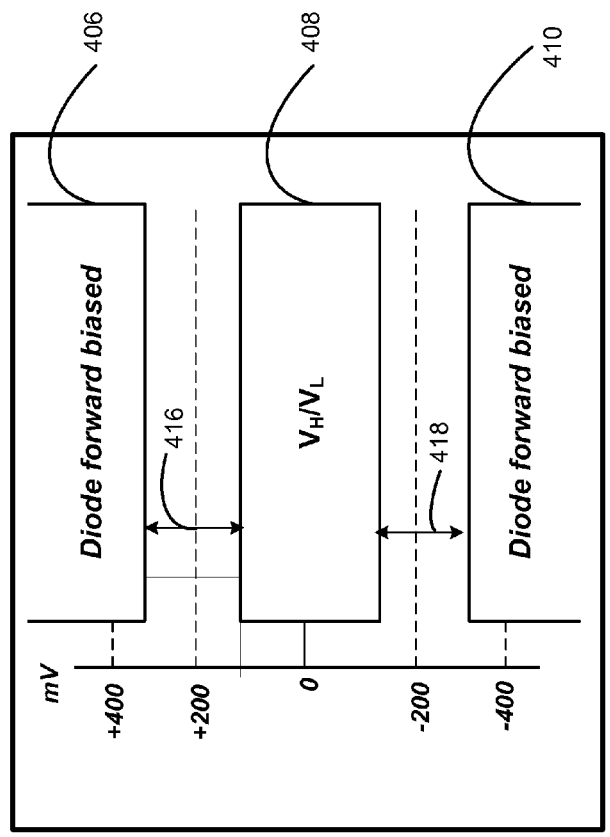
FIG. 4B illustrates a voltage swing of a signal in the data transmission system of FIG. 4A, according to one embodiment.

The data transmission system 400 additionally includes ESD (Electrostatic Discharge) protection devices 402, 404. In one embodiment, each ESD protection device 402, 404 is comprised of a pair of cross-coupled diodes connected between the signaling voltage 132 and the GND reference voltage 130 of the single-ended signaling system, with ESD protection device 402 connected on the transmitter side 102 and the ESD protection device 404 connected on the receiver side 104. Note that the cross-coupled diodes in ESD protection device 404 are coupled between the inputs of the input amplifier 112 in parallel with resistor 116. The ESD protection devices 402, 404 have the benefit of reducing the input capacitance of the I/O pins 133, 134 and 136, 138 and protecting the pins 133, 134 and 136, 138 from electrostatic discharge. Also, as shown in FIG. 4B, the allowed voltage swing 408 ($V_L$=−50 mV to $V_H$=+50 mV) of the signaling voltage 132 should be within the margins 416, 418 between the regions 406, 408 in which diodes 402, 404 become forward biased. Symmetrically connecting the diodes 402, 404 to the GND signaling reference voltage 130 allows the voltage swing of the signaling voltage on line 132 to be larger than for asymmetric connection, because the margins 416, 418 between the regions 406, 410 also become symmetrical with respect to the GND reference voltage 130 and thus no margins 416, 418 between the two regions 406, 410 are wasted.

Figure 5A:
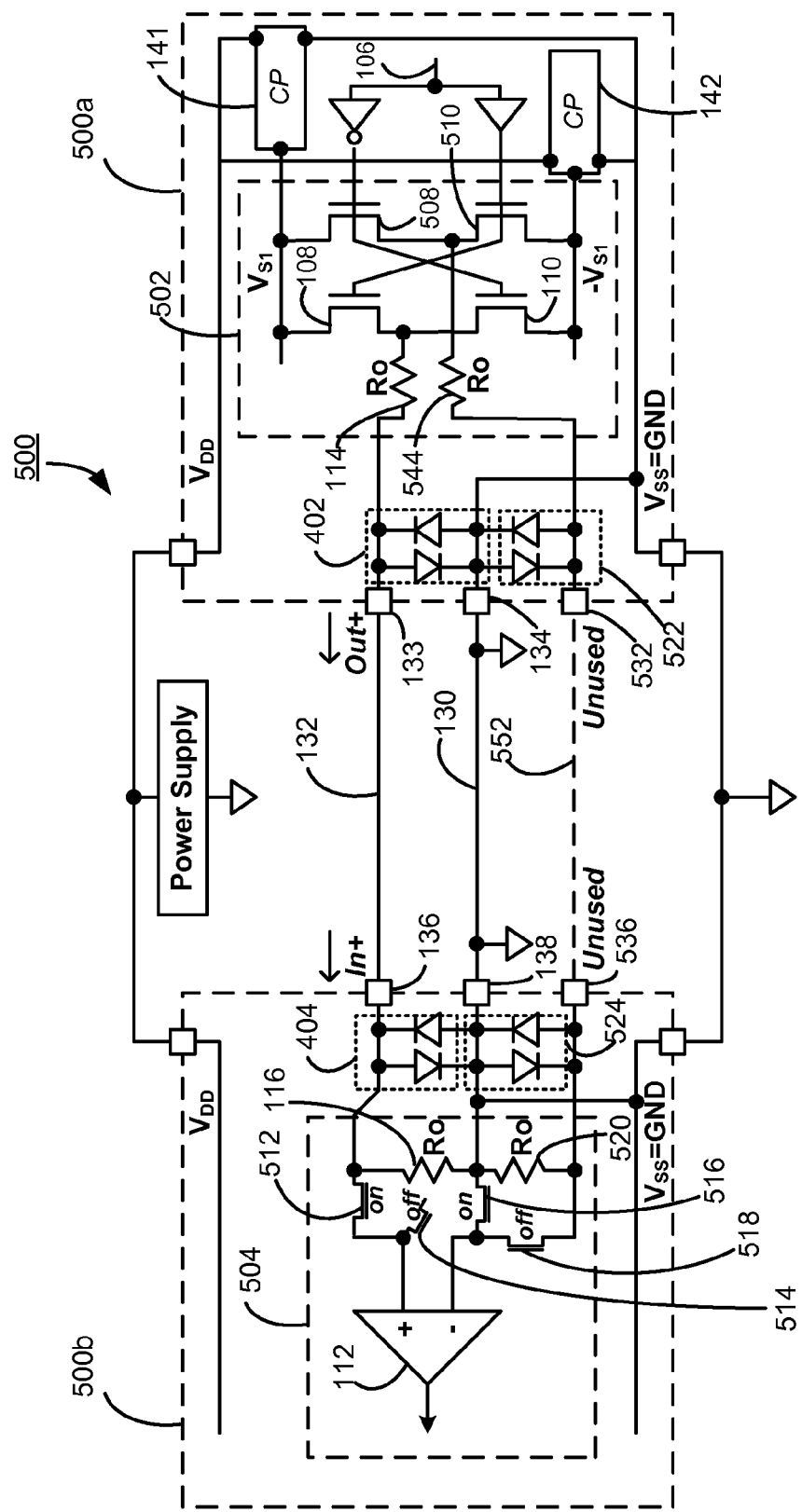
FIG. 5A illustrates a configurable data transmission system configured in a single-ended signaling mode, according to one embodiment.

FIG. 5A illustrates a configurable data transmission system configured in single-ended signaling mode, according to one embodiment. The data transmission system 500 includes circuits 500a, 500b. Circuit 500a includes a transmitter 502 and circuit 500b includes a receiver 504. Transmitter 502 and receiver 504 and employs the ground-referenced single-ended signaling as described above using the signaling line 132 and GND reference line 130. Charge pumps (CP) 140, 142 supply the positive and negative signal supply voltages $V_{S1}$ and $-V_{S1}$ for generating the signaling voltage on line 132, and either switch 108 or switch 110 is turned on to source or sink line current on the signaling line 132 responsive to input data 106 as explained above. The signaling voltage is detected across resistor 116 and detected by input amplifier 112 to recover the input data 106. ESD protection devices 402, 404 each comprised of a pair of cross-coupled diodes are also connected between the terminals 133, 134 and between the terminals 136, 138, respectively.

Circuit 500a additionally includes terminal 532 and ESD protection device 522, and transmitter 502 additionally includes switches 508, 510 and resistor 544. Circuit 500b additionally includes ESD protection device 524 and terminal 536, and the receiver 504 additionally includes switches 512, 514, 516, 518. An additional transmission line 552 is coupled between terminal 532 and terminal 536. Terminals 133, 134, 532 form one configurable unit (set) of pins of the transmitter 502 among a number of output pins that would be present on the IC including the transmitter 502. Similarly, terminals 136, 138, 536 form one configurable unit (set) of pins of the receiver 504 among a number of output pins that would be present on the IC including the receiver 504. However, when the data transmission system 500 is used in single-ended signaling mode, terminals 532, 536, line 552, ESD protection devices 522, 524 are not used, because switch 518 is turned off, disconnecting the input amplifier 112 from terminal 536 and line 552. Also, switch 512 and switch 518 are turned on, connecting terminals 136 and 138 to the inputs of amplifier 112. Switch 514 is a dummy transistor for providing matched loading corresponding to switch 518, but is also turned off. On the transmitter side 502, switches 508, 510 and resistor 544 are not used because they are connected to line 552 that is disconnected from input amplifier 512. Thus, the data transmission system 500 is configured for single-ended signaling mode, similar to the transmission system 400 of FIG. 4, using signaling line 132 and the GND reference line 130.

Figure 5B:
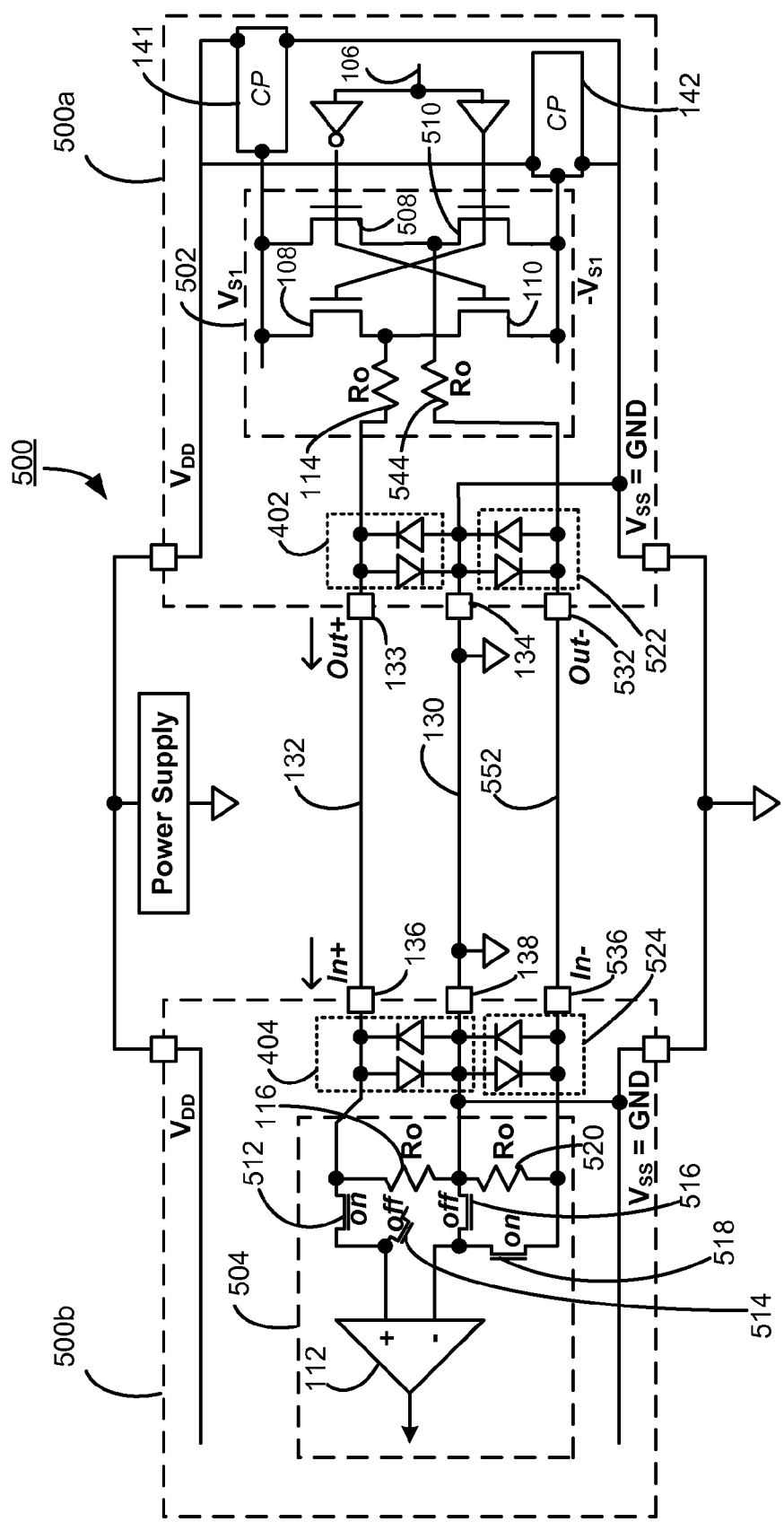
FIG. 5B illustrates a configurable data transmission system configured in a differential signaling mode, according to one embodiment.

FIG. 5B illustrates a configurable data transmission system configured in differential signaling mode, according to one embodiment. The components and structure of the data transmission system 500 shown in FIG. 5B are the same as those of the data transmission system 500 shown in FIG. 5A. However, the data transmission system 500 in FIG. 5B is configured to operate in differential signaling mode. Differential signaling transmits data by means of two complementary signals sent on two separate wires. Here, lines 132 and 552 are used as the complementary (positive and negative) signaling lines for differential signaling, and the GND reference line 130 is not used. On the receiver side 504, switches 512, 518 are turned on to connect terminals 136, 536 (and signaling lines 132, 552) to input amplifier 112, respectively, but switch 516 is turned off to disconnect terminal 138 (and the GND reference line 130) from the input amplifier 112. Switch 514 is also turned off. On the transmitter side 502, both pairs of switches 108, 110 and 508, 510 are used to generate the complementary differential signals to be sent over transmission lines 132, 552. Switches 108, 110 are connected to signaling line 132 via resistor 114 to generate the positive differential signal (Out+) on line 132, and switches 508, 510 are connected to signaling line 552 via resistor 544 to generate the negative differential signal (Out−). Further, both ESD protection devices 402, 522 are used on the transmitter side 502 and both ESD protection devices 404, 524 are used on the receiver side 504. Thus, the data transmission system 500 is configured for differential signaling mode, using both signaling lines 132, 552 and terminals 133, 532 on transmitter side 502 and terminals 136, 536 on the receiver side 504.

The data transmission system described in FIGS. 5A and 5B is configurable to a single-ended signaling system or a differential signaling system in a convenient manner, simply by turning on or off switches 516, 518. For example, by adding a pin (e.g., pin 536) for every pair of pins (pins 136, 138) on the receiver side 504, a signaling interface that is configurable and versatile with high signal integrity can be achieved.

Alternatively, no additional pins are required. In single-ended signaling mode each pair of pins are line pin and reference or GND pin, respectively. In differential signaling mode they are lineP pin and lineN pin, respectively. The lineN half of the transmitter is turned off in single-ended signaling mode, and a large NFET switch can connect what was lineN to internal Vss. A dummy switch on lineP can be added to avoid imbalances. Both terminals would have cross-coupled diodes returned to the GND rail. At the receiver, no switches are required. The lineN input can just be connected to GND. Thus, a configurable signal transmission system similar to that described in FIGS. 5A and 5B but without the extra pins 536 and 532 can be formed.

It should be noted that the various integrated circuits, dice and packages disclosed herein may be described using computer aided design tools and expressed (or represented), as data and/or instructions embodied in various computer-readable media, in terms of their behavioral, register transfer, logic component, transistor layout geometries, and/or other characteristics.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Signals and signaling paths shown or described as being single-ended may also be differential, and vice-versa. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, various modifications and changes may be made thereto without departing from the broader spirit and scope. For example, features or aspects of any of the embodiments may be applied, at least where practicable, in combination with any other of the embodiments or in place of counterpart features or aspects thereof Accordingly, the specification and drawings are to be regarded in an illustrative rather than a restrictive sense.

What is claimed is:

1. A circuit to be coupled to a power supply, comprising:
    first and second terminals, the second terminal to be at a power supply voltage after being coupled to the power supply; and
    a transmitter configured to transmit a signal via the first terminal, the signal having a voltage level that is referenced to the power supply voltage and that swings substantially symmetrically above and below the power supply voltage;
    wherein the circuit is formed on a semiconductor substrate mounted on a packaging substrate having a power plane, and the second terminal is coupled to the power plane.

2. The circuit of claim 1, wherein the second terminal is part of a signal return path for the signal.

3. The circuit of claim 1, wherein the power supply voltage is a ground voltage.

4. The circuit of claim 1, wherein the power supply voltage is other than a ground voltage.

5. The circuit of claim 1, wherein the circuit transmits the signal while drawing a power supply current from the power supply that is substantially independent of the voltage level of the signal.

6. The circuit of claim 1, further comprising:
    a first charge pump drawing a first supply current from the power supply while the voltage level of the signal is at or near a first voltage; and
    a second charge pump drawing a second current from the power supply while the voltage level of the signal is at or near a second voltage, the first voltage and the second voltage being substantially symmetrical with respect to the power supply voltage and the second current being substantially equal to the first current.

7. The circuit of claim 1, wherein the power plane is a ground plane.

8. The circuit of claim 1, wherein the packaging substrate includes a ball grid array, and
    the second terminal is coupled to an inner ball of the ball grid array.

9. The circuit of claim 1, wherein the power plane serves as part of a signal return path for the signal.

10. The circuit of claim 1, wherein the transmitter further comprises a pair of cross-coupled diodes coupled between the first terminal and the second terminal to prevent electrostatic discharge damage to the circuit.

11. The circuit of claim 1, further comprising a third terminal, wherein the transmitter is configurable to operate in either a single-ended signaling mode in which the transmitter outputs a single-ended signal via the first terminal, or a differential signaling mode in which the transmitter outputs a differential signal via the first and third terminals.

12. The circuit of claim 1, further comprising:
    a receiver amplifier including a first input and a second input coupled to the first terminal and the second terminal, respectively, the receiver amplifier configured to detect a voltage difference between a signaling voltage at the first terminal with reference to the power supply voltage at the second terminal.

13. A circuit to be coupled to a power supply, comprising:
    first and second terminals, the second terminal to be at a power supply voltage after being coupled to the power supply;
    a transmitter configured to transmit a signal via the first terminal, the signal having a voltage level that is referenced to the power supply voltage and that swings substantially symmetrically above and below the power supply voltage;
    a receiver amplifier including a first input and a second input coupled to the first terminal and the second terminal, respectively, the receiver amplifier configured to detect a voltage difference between a signaling voltage at the first terminal with reference to the power supply voltage at the second terminal;

wherein the power supply voltage is a ground voltage and the signaling voltage swings above and below the ground voltage.

14. The circuit of claim 1, further comprising:
third and fourth terminals, the fourth terminal being coupled to the power supply voltage; and
a receiver amplifier including a first input and a second input coupled to the third terminal and the fourth terminal, respectively, the receiver amplifier configured to detect a voltage difference between a signaling voltage at the third terminal with reference to the power supply voltage at the fourth terminal.

15. The circuit of claim 14, wherein the fourth terminal is the same as the second terminal.

16. A circuit to be coupled to a power supply, comprising:
first and second terminals, the second terminal to be at a power supply voltage after being coupled to the power supply; and
a receiver amplifier including a first input and a second input coupled to the first terminal and the second terminal, respectively, the receiver amplifier configured to detect a voltage difference between a signaling voltage at the first terminal with reference to the power supply voltage at the second terminal;
wherein the circuit is formed on a semiconductor substrate mounted on a packaging substrate having a power plane, and the second terminal is coupled to the power plane.

17. The circuit of claim 16, wherein the power supply voltage is a ground voltage and the signaling voltage swings above and below the ground voltage.

18. The circuit of claim 16, wherein the power supply voltage is other than a ground voltage.

19. The circuit of claim 16, further comprising a pair of cross-coupled diodes coupled between the first terminal and the second terminal to prevent electrostatic discharge damage to the circuit.

20. A method of transmitting a signal over a transmission line using a transmitter having a first terminal coupled to the transmission line and a second terminal at a power supply voltage, the method comprising:
receiving a first data bit of a first digital value;
generating a first output voltage representing the first data bit for outputting to the transmission line, the first output voltage being above the power supply voltage and causing a first output current to flow out of the first terminal and into the second terminal;
receiving a second data bit of a second digital value different from the first digital value;
generating a second output voltage representing the second data bit for outputting to the first transmission line, the second output voltage being below the power supply voltage and causing a second output current to flow out of the second terminal and into the first terminal; and
drawing a first supply current from a power supply while generating the first output voltage and drawing a second supply current from the power supply while generating the second output voltage, the first supply current being substantially equal to the second supply current.

21. The method of claim 20, wherein the power supply voltage is a ground voltage.

22. The method of claim 20, wherein the power supply voltage is other than a ground voltage.

23. The method of claim 20, further comprising:
generating a first signal supply voltage using a first charge pump, the first output voltage being derived from the first signal supply voltage; and
generating a second signal supply voltage using a second charge pump, the second output voltage being derived from the second signal supply voltage, the first charge pump and the second charge pump drawing substantially same amount of current from the power supply.

24. The method of claim 20, wherein the first output voltage and the second output voltage are substantially symmetrical with respect to the power supply voltage.

25. A circuit, comprising:
a first terminal, a second terminal, and a power supply terminal, the power supply terminal to be coupled to a power supply voltage; and
a transmitter configurable to operate in either a single-ended signaling mode or a differential signaling mode, the transmitter in the single-ended signaling mode configured to transmit a single-ended signal via the first terminal, the single-ended signal having a signal return path through the power supply terminal and a signaling voltage that is referenced to the power supply voltage and that swings above and below the power supply voltage, the transmitter in the differential signaling mode configured to transmit a differential signal via the first and second terminals.

26. The circuit of claim 25, wherein the transmitter in the single-ended signaling mode draws a current from a power supply that is substantially independent of the signaling voltage at the first terminal.

27. The circuit of claim 25, wherein the power supply terminal is at ground voltage in the single-ended signaling mode.

28. The circuit of claim 25, further comprising a first pair of cross-coupled diodes coupled between the first terminal and the power supply terminal and a second pair of cross-coupled diodes coupled between the second terminal and the power supply terminal.

29. A circuit configurable to operate in either a first signaling mode or a second signaling mode, the circuit comprising:
a first terminal for coupling to a first external signal transmission line, a second terminal for coupling to a second external signal transmission line, and a power supply terminal for coupling to a power supply voltage;
an amplifier having first and second inputs; and
switching circuitry configured to couple the first input of the amplifier to the first terminal and the second input of the amplifier to the power supply terminal so as to configure the circuit to operate in the first signaling mode, the switching circuitry configured to couple the first input of the amplifier to the first terminal and the second input of the amplifier to the second terminal so as to configure the circuit to operate in the second signaling mode.

30. The circuit of claim 29, wherein the first signaling mode is a single-ended signaling mode and the second signaling mode is a differential signaling mode.

31. The circuit of claim 29, wherein the power supply voltage is ground voltage.

32. The circuit of claim 29, further comprising a first pair of cross-coupled diodes coupled between the first terminal and the power supply terminal and a second pair of cross-coupled diodes coupled between the second terminal and the power supply terminal.

33. A communication system, comprising:
a circuit board having a power supply plane and at least one signal transmission line;
a first circuit on the circuit board, the first circuit having a first terminal coupled to a signal transmission line and a second terminal coupled to the power supply plane, the first circuit to transmit a signal via the first terminal over the transmission line, the signal being referenced to a voltage of the power supply plane and having a return path through the power supply plane; and a second circuit on the circuit board, the second circuit having a third terminal coupled to the signal transmission line and a fourth terminal coupled to the power supply plane, the second circuit to receive the signal from the signal transmission line and to detect a voltage difference between a signaling voltage at the third terminal with reference to the voltage of the power supply plane.

34. The communication system of claim 33, wherein the power supply plane is a ground plane, and wherein the signal swings between a positive voltage and a negative voltage.

35. The communication system of claim 34, wherein the positive voltage and the negative voltage are symmetrical with respect to a ground voltage of the ground plane.

36. The communication system of claim 33, wherein the first circuit is configured to be coupled to a power supply and to draw a power supply current from the power supply that is substantially independent of a voltage level of the signal.

37. The communication system of claim 33, wherein the power supply plane includes a plurality of conducting lines each coupled to a same power supply voltage.

* * * * *